United States Patent
Carey

(10) Patent No.: US 7,474,129 B2
(45) Date of Patent: Jan. 6, 2009

(54) DUAL MODE COMPARATOR

(75) Inventor: Brian Carey, Marlborough, MA (US)

(73) Assignee: Analog Devices, Inc., Norwood, MA (US)

( * ) Notice: Subject to any disclaimer, the term of this patent is extended or adjusted under 35 U.S.C. 154(b) by 24 days.

(21) Appl. No.: 11/409,712

(22) Filed: Apr. 24, 2006

(65) Prior Publication Data

US 2006/0250165 A1    Nov. 9, 2006

Related U.S. Application Data

(60) Provisional application No. 60/674,580, filed on Apr. 25, 2005.

(51) Int. Cl.
*H03K 5/22* (2006.01)

(52) U.S. Cl. .......................... 327/65; 327/407; 327/408

(58) Field of Classification Search .................. 327/58, 327/62, 63, 65, 66, 71, 74, 75, 77, 82, 89, 327/407, 408
See application file for complete search history.

(56) References Cited

U.S. PATENT DOCUMENTS 5,191,234 A * 3/1993 Murakami et al. .......... 327/172
5,430,400 A * 7/1995 Herlein et al. .............. 327/108
5,465,072 A * 11/1995 Atarodi ...................... 330/254
2005/0184791 A1 * 8/2005 Neumann ................... 327/407

* cited by examiner

*Primary Examiner*—Tuan T Lam
*Assistant Examiner*—Diana J Cheng
(74) *Attorney, Agent, or Firm*—Bromberg & Sunstein LLP

(57) ABSTRACT

A dual mode comparator circuit is disclosed. The dual mode comparator includes a plurality of differential transistor pairs. Each differential transistor pair includes a plurality of inputs and outputs. The outputs of the differential transistor pairs are coupled to inputs of a multiplexor. The multiplexor includes at least one control input for selecting between the multiplexor inputs and provides the selected input to the multiplexor output. The dual mode comparator further includes a comparator back end that is coupled to the output of the multiplexor. The comparator back end may include a folded cascode and additional gain stages. The comparator back end provides the comparator output to the next stage. The dual mode comparator may be used in automatic testing equipment embodiments.

19 Claims, 7 Drawing Sheets

DUAL MODE COMPARATOR

PRIORITY

The present U.S. Patent Application claims priority from U.S. Provisional Patent Application No. 60/674,580 filed on Apr. 25, 2005 entitled "Dual Mode Comparator" which is incorporated by reference herein in its entirety.

TECHNICAL FIELD AND BACKGROUND ART

The present invention relates to comparators and more specifically to dual mode comparators.

It is known in the prior art to have dual mode comparators. Dual mode comparators are often used in automatic testing equipment (ATE) for testing one or more devices under tests (DUTs). Dual mode comparators can operates in any one of a plurality of modes including a differential mode, a common mode, and single-ended mode wherein the mode is selectable based upon an external selection signal provided to the dual mode comparator. The prior art designs provide separate circuitry for each of the modes. Additionally, for each comparison, there is a separate normal windowing comparator (NWC) as shown in FIG. 1.

FIG. 1 shows two inputs provided into the prior art dual mode comparator circuit, which are labeled DUT1 101 and DUT2 102. These inputs are each coupled to a device under test. These inputs may be attached to two separate inputs from a single device or the inputs may be coupled to two separate devices. The circuit includes a pair of output multiplexors (MUX) 103, 104. Each multiplexor receives a control signal that determines the selected comparator mode to output. Thus, by way of example, for the first multiplexor 103, each NWC 110, 111, 112, 113 is active and produces an output signal. Therefore, the multiplexor 103 receives in four input signal and selects two of the four input signals to output (either a single ended comparison of DUT1 with VOH1 and a single ended comparison of DUT1 with VOL1, or a differential comparison with VOH1 and a differential comparison with VOL1). As a result, each NWC 110, 111, 112, 113 circuit is always active. Each NWC 110, 111, 112, 113 circuit includes at least two stages, a comparison stage and an amplification stage. Therefore, the prior art configuration always requires power for the NWC.

SUMMARY OF THE INVENTION

A dual mode comparator circuit is disclosed. The dual mode comparator includes a plurality of differential transistor pairs. Each differential transistor pair includes a plurality of inputs and outputs. The outputs of the differential transistor pairs are coupled to inputs of a multiplexor. The multiplexor includes at least one control input for selecting between the multiplexor inputs and provides the selected input to the multiplexor output. The dual mode comparator further includes a comparator back end that is coupled to the output of the multiplexor. The comparator back end may include a folded cascode and additional gain stages. The comparator back end provides the comparator output to the next stage. The dual mode comparator may be used in automatic testing equipment embodiments wherein both power and space are at a premium. The disclosed dual mode comparator circuit reduces both the required power and reduces the silicon area need to implement the dual mode comparator as compared with the prior art.

In certain embodiments, the differential transistor pairs are formed from a plurality of bipolar transistors. In other embodiments, other transistor types, such as, CMOS transistors may be employed. In embodiments that use the bipolar transistors, the bipolar transistors each include an emitter, collector and base. The input for each differential transistor pair is received into the base of the transistors. The multiplexor is coupled to the collector of the bipolar transistors. A current source is provided at the emitters of the differential bipolar transistor pairs. In one embodiment, additional current sources are coupled between the output of the multiplexor and the input of the comparator back end. In other embodiments, additional current sources may be coupled between the differential transistor pairs and the inputs to the multiplexor.

During operation, the multiplexor will route the differential input signal from the differential transistor pair either to the comparator back end or to a voltage rail. Thus, there are two states for each input to the multiplexor. The multiplexor can be formed from a plurality of bipolar transistor pairs where the emitters of an input pair of transistors of the multiplexor are coupled to the collectors of a differential transistor pair and the collectors of an output pair of transistors of the multiplexor are coupled to a comparator back end.

Also disclosed is a method for selection of an input signal in a dual mode comparator. First, an input signal is compared with another signal (either a reference voltage or another input signal) using a differential transistor pair. The differential transistor pair generates an output based upon the two input signals. A multiplexor is coupled to the output of the differential transistor pair, where a selection signal is received by the multiplexor and the output of the desired differential transistor pair is received by the comparator back end. The comparator back end includes a gain stage that amplifies the desired differential signal.

Embodiments of the dual mode comparator reduce the number of gain stages, since a single comparator back end may be shared by a plurality of comparator front ends/differential transistor pairs.

The dual mode comparator benefits from operating in the current domain, such that the additional capacitance that occurs due to the additional circuitry being coupled to the input node of the front end does not decrease performance.

BRIEF DESCRIPTION OF THE DRAWINGS

The foregoing features of the invention will be more readily understood by reference to the following detailed description, taken with reference to the accompanying drawings, in which.

DETAILED DESCRIPTION OF SPECIFIC EMBODIMENTS

As used in the following detailed description and appended claims, the term "dual-mode" shall refer to a comparator's ability to selectably operate in more than one mode for comparing signals (e.g. single-ended mode, differential mode, common mode). The term "comparator back end" shall refer to passive or active circuitry that completes the first gain stage of a comparator subsequent to a differential transistor pair and the comparator back end may contain additional gain stages.

Figure 1:
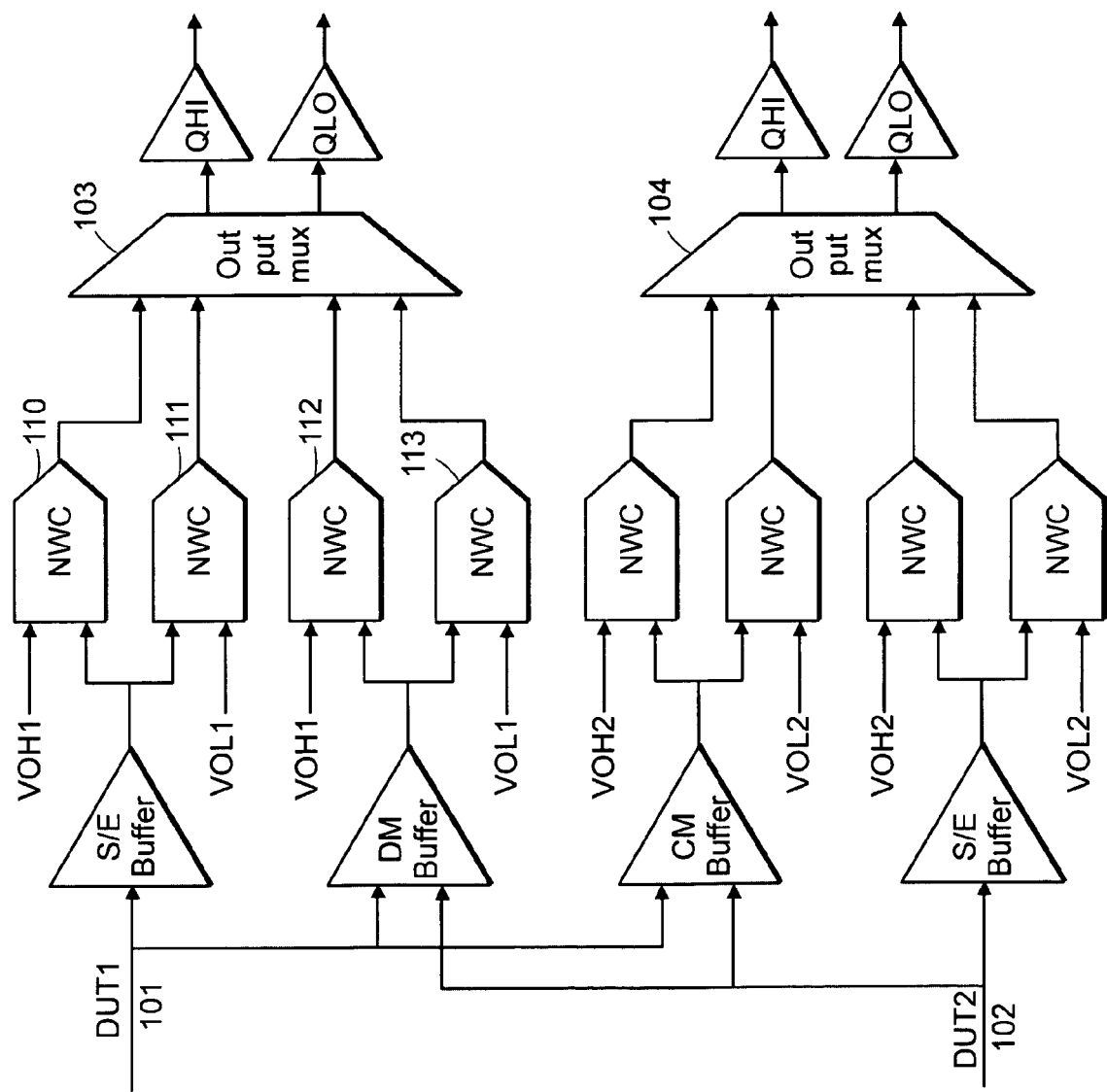
FIG. 1 is a diagram of a prior art dual mode comparator.
Figure 2:
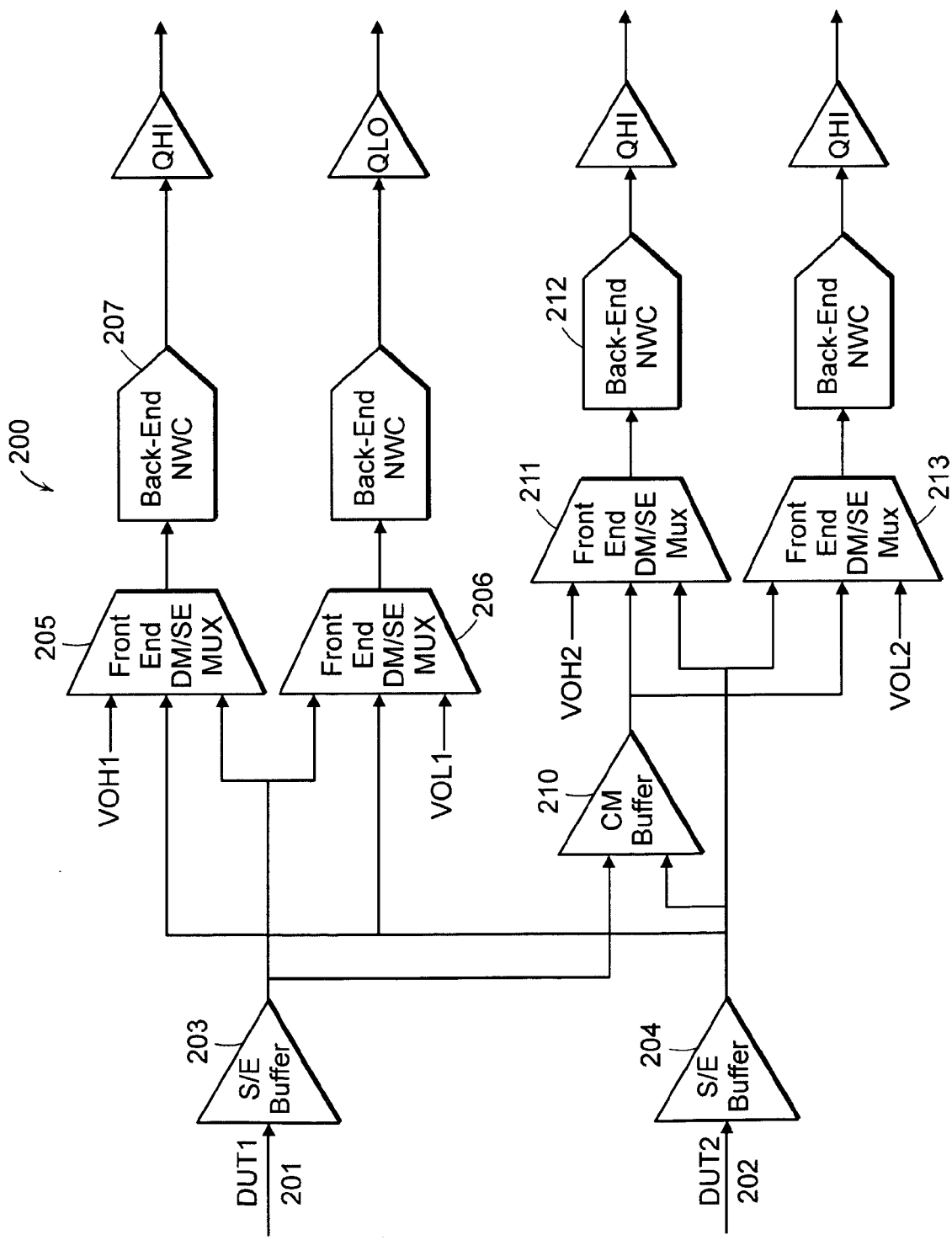
FIG. 2 is a diagram of one embodiment of the dual mode comparator circuit invention.

FIG. 2 is a dual mode comparator circuit 200 that performs all of the functions of FIG. 1, but reduces the redundancy of the window comparators. In FIG. 2, the front-end of each comparator is separated from the back-end. Thus, the differential transistor pair that is used for performing the comparison is coupled to a multiplexor and the comparator back end is shared by more than one differential transistor pair. In this configuration, as compared to FIG. 1, the number of comparator back ends that are required is reduced by half. Thus, the number of gain stages is reduced, thereby significantly reducing the power consumption and silicon area. The dual mode comparator of FIG. 2 may be used in ATE applications where both reduction of silicon area and power consumption are desirable. The dual mode comparator may be part of the pin electronics for a channel of the ATE. A channel is defined by an association of pin electronics with one or more pins of a device under test (DUT). Pin electronics include, but are not limited to, comparators, load circuitry, driver circuitry and parametric measurement units. The dual mode comparator may be formed on a silicon wafer along with other ATE specific pin electronic circuitry. Current automatic testing equipment can test hundreds to thousands of pins of DUTs simultaneously. Thus, by reducing the silicon area and power consumption for the pin electronics additional pin electronics can be added to the ATE and more DUT pins tested.

The dual mode comparator 200 includes a pair of inputs 201, 202. The two inputs are coupled to devices under test (DUTs) that produce input signals. The first stage for each input signal is a single ended buffer 203, 204 that buffers the signals within the dual mode comparator from the connected DUT. The output of the single-ended buffer for DUT1 is coupled to the input of two front end differential mode/single ended multiplexors (DM/SE Mux) 205, 206. The first front end DM/SE Mux 205 includes both a differential mode and a single ended mode of operation. Depending on the control signal provided to the front end DM/SE MUX 205, the front end DM/SE MUX 205 will either compare the differential input signal (input signal of DUT1-input signal of DUT2) with a known comparison signal, VOH1 or compare the input signal of DUT1 to VOH1. The front end DM/SE MUX 205 outputs the comparison signal to the comparator back-end 207 that includes a gain stage. Thus, two comparisons are performed wherein only a single comparator back end 207 is used. The second front end DM/SE MUX 206 operates substantially the same as the first; however, comparisons are made with VOL1 instead of VOH1.

Looking at the lower half of the circuit, a common mode buffer 210 receives both the input signals from the DUT1 and DUT2. The common mode buffer creates a common mode signal from the two input signals by adding the signals together and dividing the resulting signal in half. A front end common mode/single ended multiplexor (CM/SE MUX) 211 receives as input the output of the CM buffer 210 and additionally receives in the input signal from DUT2. Thus, depending on the control signal received by the multiplexor, the front end CM/SE MUX 211 will compare either the common mode signal with a known level, VOH2 or compare the input signal from DUT2 with VOH2. A comparator back end 212 then receives the selected signal from the front end CM/SE MUX 211 and amplifies the differential signal to a desired level producing QHI2. The fourth front end, front end CM/SE MUX 213 operates the same as the third front end except the comparisons are made with VOL2 and the output from the dual mode comparator is QLO2.

Figure 3:
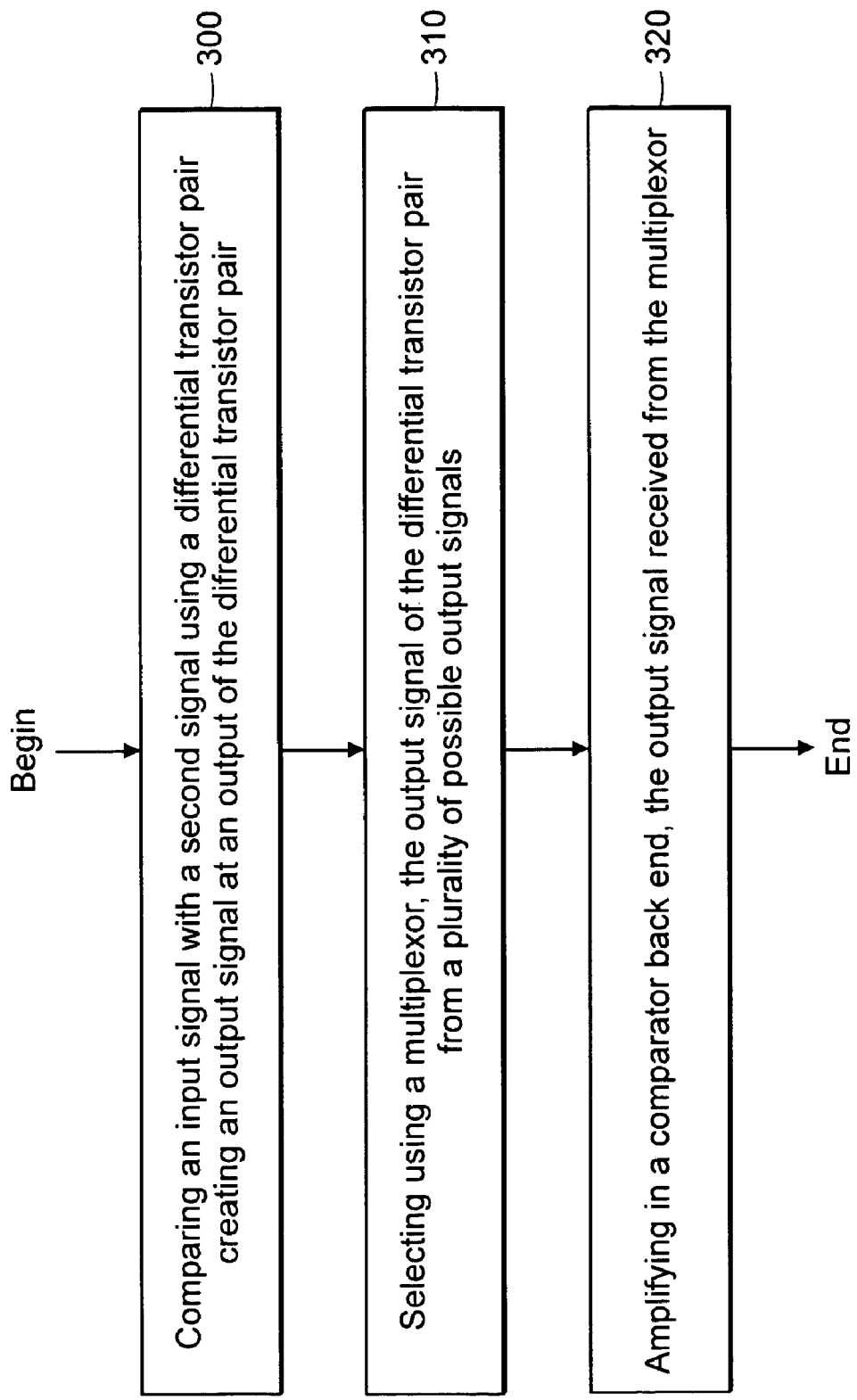
FIG. 3 is a flow chart that describes a method of processing a signal in a dual mode comparator.

FIG. 3 is a flow chart that describes the methodology of processing a signal in one embodiment of the invention. The dual mode comparator receives in as input a voltage signal. The voltage signal can be generated by a DUT. The signal is fed into the input of a differential transistor pair. At the other input of the differential transistor pair is a comparison signal. In some embodiments, the comparison signal is at a known level (Ref). In other embodiments, the comparison signal may be a voltage signal from another input. The differential transistor pair produces a differential current output 300. A control signal is received by a multiplexor positioned between the differential transistor pair and a comparator back end. The control signal causes the multiplexor to select from a plurality of differential transistor pairs and provides the differential current to the comparator back end 310. The comparator back end amplifies the differential current output produced by the selected differential transistor pair 320.

Figure 4:
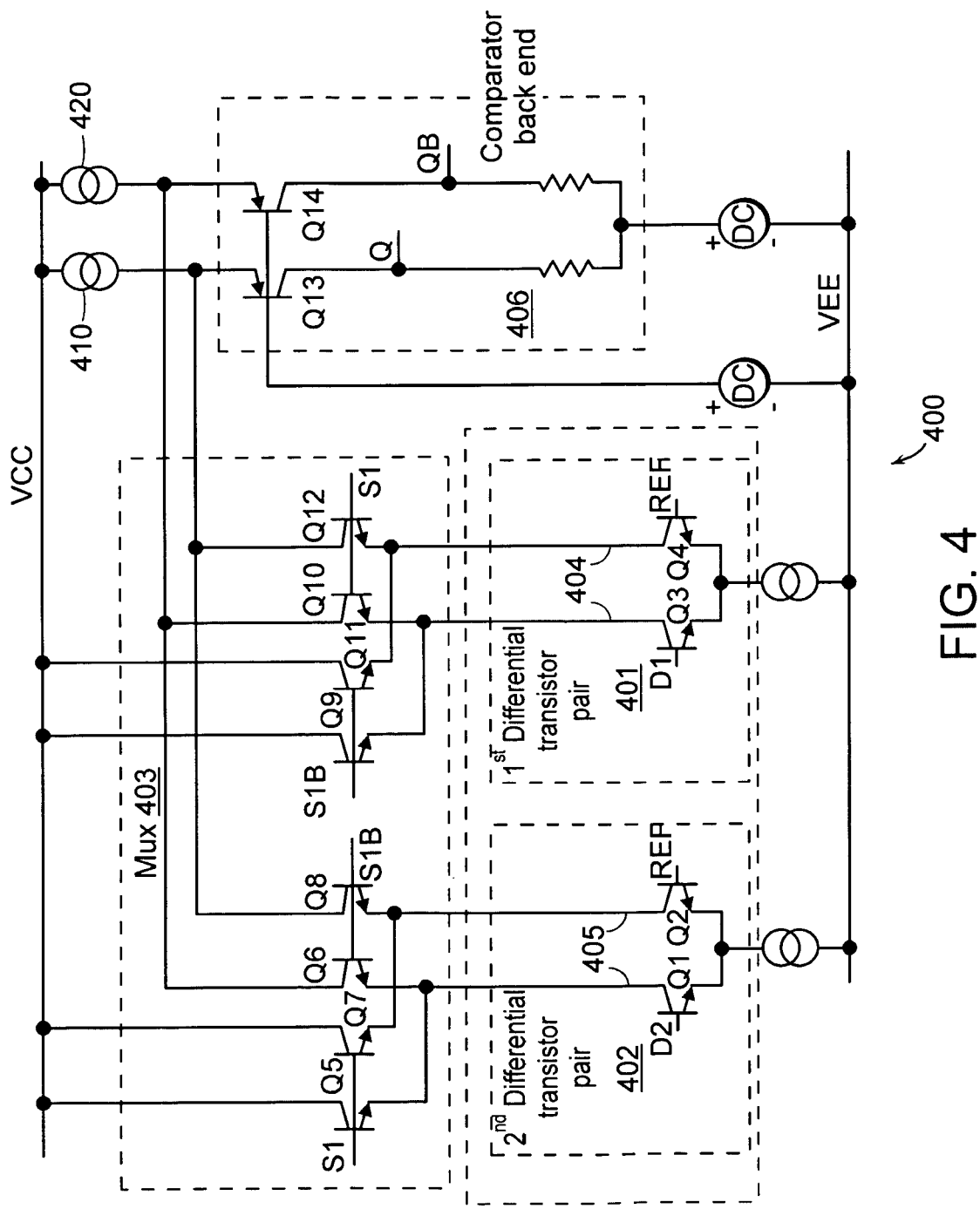
FIG. 4 is a circuit schematic showing a first embodiment of the invention.

FIG. 4 is a circuit schematic showing a first embodiment of the dual mode comparator. As shown, there are two sets of differential transistor pairs 401, 402 capable of receiving input signals D1, D2 and comparing the signals to a reference (Ref) in the dual mode comparator circuit 400. Although two sets of differential transistor pairs are shown, the invention should not be seen as limited to two inputs. Additionally, although the figure shows the differential transistor pairs as bipolar transistors, other transistors may be substituted without deviating from the scope of the invention. Input signal D1 is applied as input to the first differential transistor pair 401 and input signal D2 is applied to the second differential transistor pair 402. The signals D1 and D2 are compared to a second signal marked Ref, which can be a reference signal (Vol, Vhi, Vt etc.) or another input signal. The second signal for each of the differential transistor pairs may be the same signal (i.e. D1 and D2 are compared to the same reference) or the signal may be different (i.e. D1 is compared to a first reference signal and D2 is compared to a second reference signal). The output of the differential transistor pairs are each coupled to inputs of the multiplexor 403. In this embodiment, the multiplexor inputs are the collectors of the bipolar transistors 404, 405. The multiplexor includes a plurality of bipolar transistors Q5-Q12. In this embodiment of the multiplexor, differential transistor pairs are controlled by an input signal that is either S1 or the inverse of S1, S1B. If S1 is high Q5 and Q7 are active and the output of the second transistor pair 402 is coupled to the rail Vcc. Additionally, if S1 is high Q10 and Q12 are active and the output of the first transistor pair 401 is coupled to the comparator back end 406 which is a folded cascode including transistors Q13, 14. If the inverse S1B is high, transistors Q6, Q8, Q9 and Q11 are active and the output 404 of the first transistor pair 401 is coupled to the voltage rail Vcc while the output 405 of the second transistor pair 402 is coupled to the comparator back end 406. As a result, only a single comparator back end is necessary for the operation of either of the two comparisons. In the configuration of FIG. 4, there is only a single control signal that is used to control the switching between the differential transistor pairs. In other embodiments in which there are more differential transistor pairs coupled to the multiplexor, additional control signals could be used for selecting the appropriate output.

Figure 5:
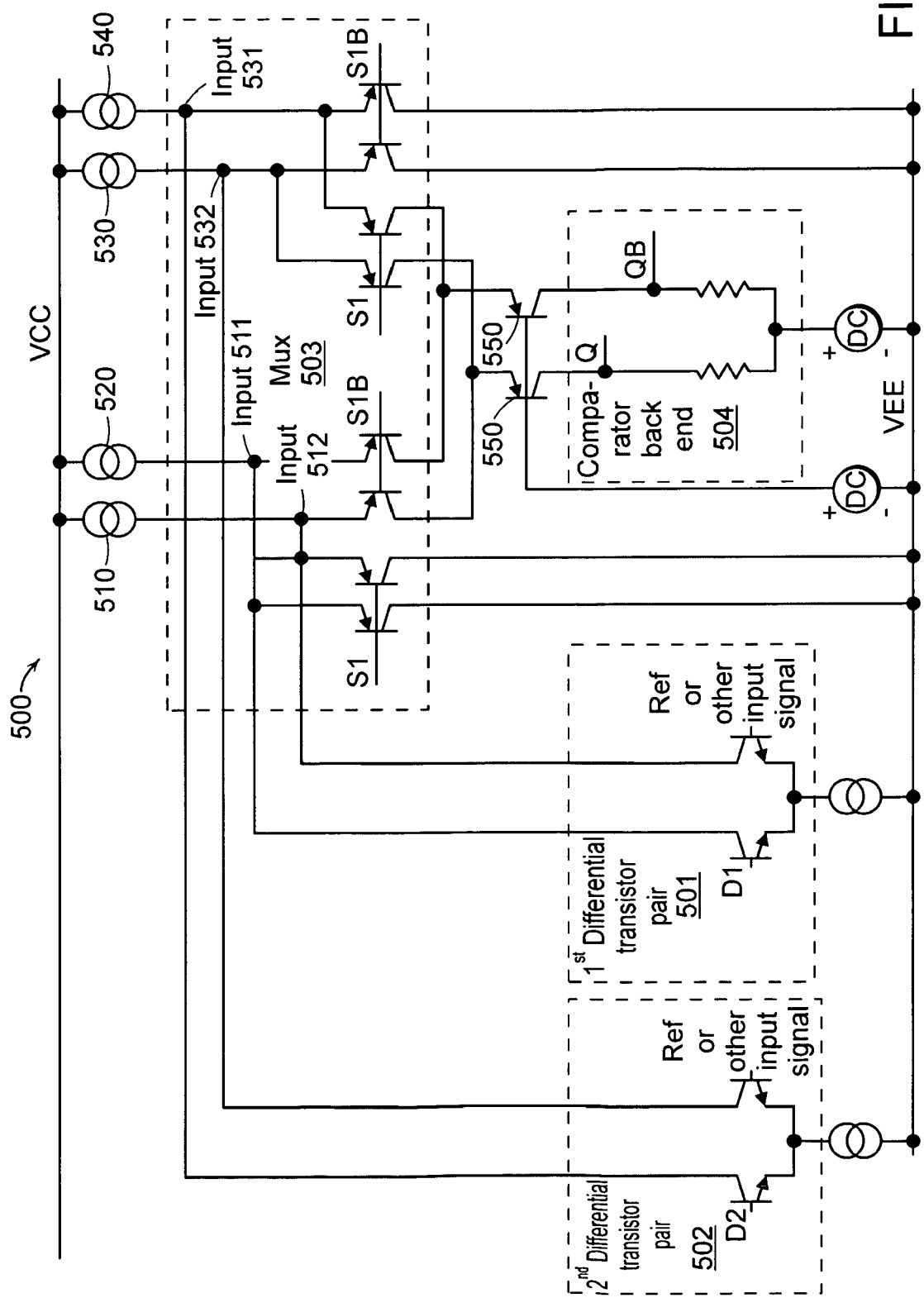
FIG. 5 is a circuit schematic showing an alternative embodiment of the invention.

FIG. 5 is an alternative embodiment of FIG. 4. In this embodiment, the current sources 510, 520, 530, 540 that provide current to the comparator back end 504 are coupled to the inputs 511, 512, 531, 532 of the multiplexor 503 as opposed to the output of the multiplexor as shown in FIG. 4. In this embodiment, four current sources 510, 520, 530, 540 are necessary to provide current to each of the possible inputs 511,512,531,532 to the multiplexor 503. In contrast, in FIG. 4, only two current sources 410, 420 are necessary, since current is only need for the selected signal that is output from the multiplexor 403. FIG. 5 operates substantially the same as the embodiment of FIG. 4. Input signals D1, D2 are applied to the differential transistor pairs which cause a differential current draw from the current sources 510, 520, 530, 540. In this embodiment, the multiplexor circuitry 503 operates both as a multiplexor and acts as a folded cascode. In FIG. 4, transistors Q13 and Q14 of the comparator back end function as a folded cascode. Depending upon whether signal S1 or S1B is high, the multiplexor 503 will direct the current from the current sources 510,520 or 530, 540 minus the current drawn away as a result of the differential transistor pairs 501 or 502 to the output of the multiplexor. The output of the multiplexor is coupled to another cascode circuit 550. This cascode 550 is included to provide a lower capacitance at the output node. The cascode 550 is not necessary for operation of the dual mode comparator 500. The output of the cascode is provided to the comparator back end 504 and the differential current/voltage can be sampled at Q and QB.

Figure 6:
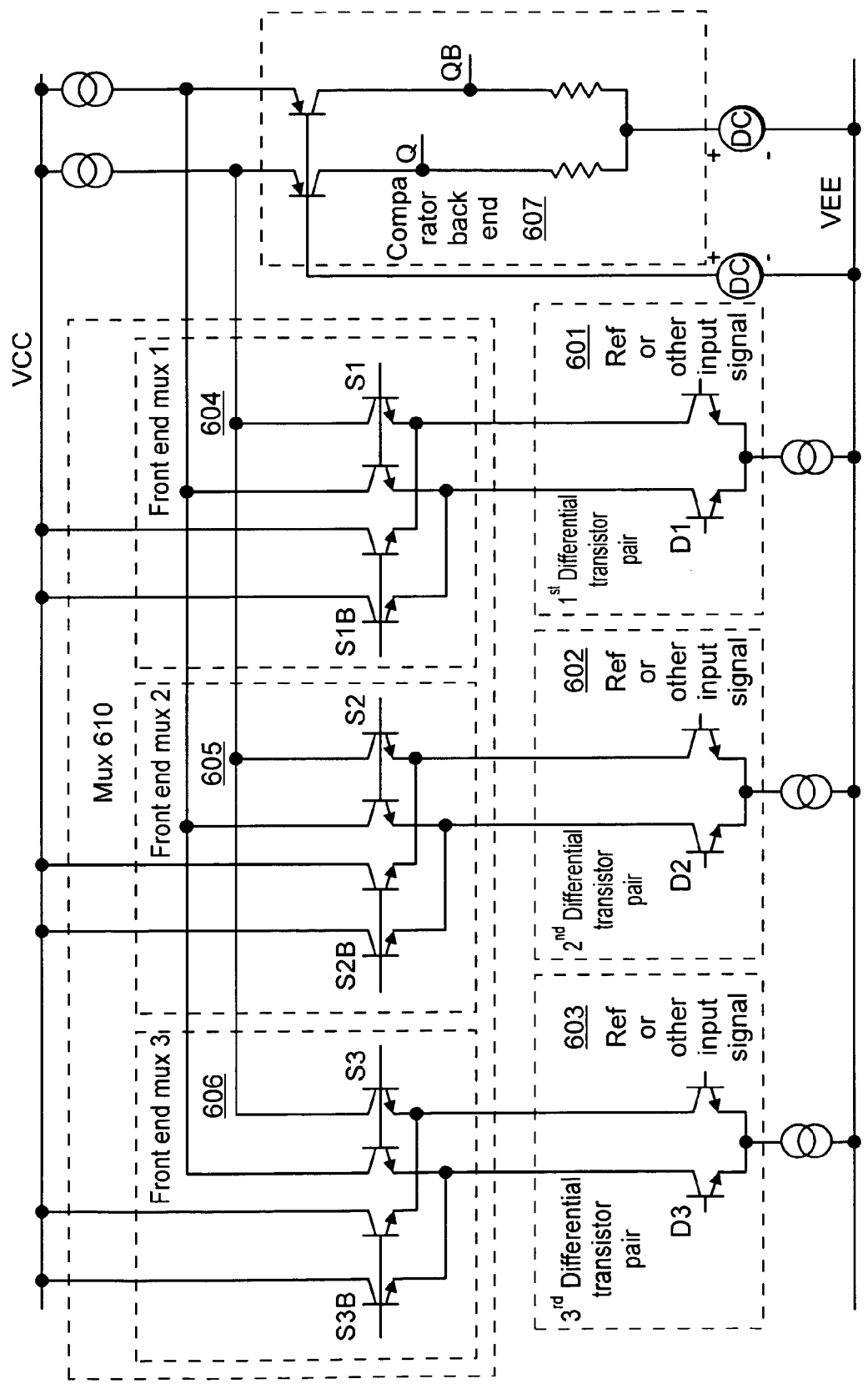
FIG. 6 is a circuit schematic showing an alternative embodiment of the invention wherein multiple differential transistor pairs are coupled to the multiplexor.

FIG. 6 is another embodiment of the dual mode comparator. In this embodiment, three differential transistor pairs (601, 602, and 603) are shown. The differential transistor pairs are coupled to the multiplexor 610. The multiplexor is subdivided into three sections 604, 605, 606, wherein each section is associated with one of the differential transistor pairs 601, 602, 603. For each section of the multiplexor, a different control signal S1, S2, S3 is used. Under normal operation, If S1 is high, the differential signal from the $1^{st}$ differential transistor pair 601 is passed to the comparator back end 607, and both S2B and S3B are active causing the signals from the $2^{nd}$ and $3^{rd}$ differential transistor pairs 602, 603 to be coupled to the voltage rail VCC. Similarly, if S2 is active S1B and S3B would be active coupling the $1^{st}$ and $3^{rd}$ differential transistor pairs 601, 603 to the voltage rail VCC and passing the differential signal from the $2^{nd}$ differential transistor pair 602 to the comparator back end 607. Likewise, if S3 is active S1B and S2B are active and only the differential signal from the $3^{rd}$ differential transistor pair is passed to the comparator back end.

Figure 7:
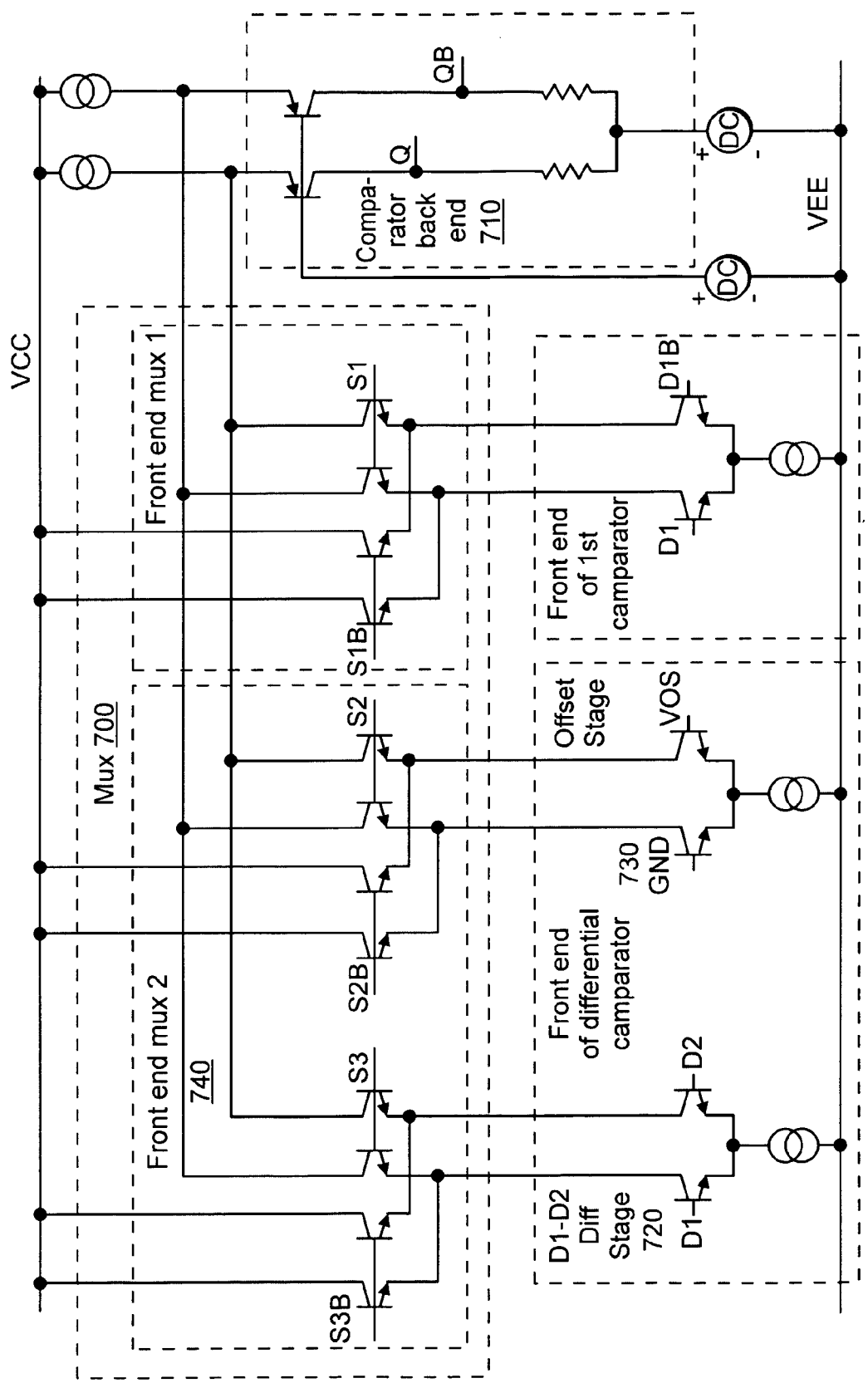
FIG. 7 is a circuit schematic showing an embodiment of the invention where two differential signals are passed to the comparator back end simultaneously through the multiplexor.

In certain embodiments, where an offset signal is desired for an output signal such as that shown in FIG. 7, the multiplexor 700 may pass to the comparator back end 710 more than one differential signal from more than one differential transistor pair simultaneously. For example, if the differential transistor pair delineated Diff Stage 720 receives in as input a differential signal (Dut1 signal–Dut2 signal), and an offset input voltage is desired for the differential signal 720, the output signal from the differential transistor pair delineated Offset Stage 730 may be passed through the multiplexor 700 simultaneously with the output signal of the Diff Stage transistor pair 720 to the comparator back end 710. In such an embodiment, both the Offset Stage 720 and Diff Stage 730 are coupled to a front end Mux 2 740 that is part of the Mux 700. The Front End Mux 2 740 is controlled by a single control signal S2. Thus, when S2 is active (high) both the Diff Stage 720 and the Offset Stage 730 pass their signals to the comparator back end 710.

As shown in FIGS. 4-7 the comparator back end completes the gain stage formed in combination with the selected differential transistor pair, however additional gain stages may be coupled to the comparator back end without deviating from the inventive concept. It should also be noted that FIGS. 4-7 show simple differential transistor pairs and do not show the coupled single ended buffer, the differential mode buffer or the common mode buffer shown in FIG. 2. These buffers may be implemented in a plurality of ways as are known to those of ordinary skill in the art.

Although various exemplary embodiments of the invention have been disclosed, it should be apparent to those skilled in the art that various changes and modifications can be made which will achieve some of the advantages of the invention without departing from the true scope of the invention. These and other modifications are intended to be covered by the appended claims.

What is claimed is:

1. A dual mode comparator circuit comprising:
   a first differential transistor pair having two inputs and outputs;
   a second differential transistor pair having two inputs and outputs;
   a third differential transistor pair having two inputs and outputs;
   a multiplexor having at least one control input for selecting the outputs of the first differential transistor pair, the outputs of the second differential transistor pair, and the outputs of the third differential transistor pair, wherein the outputs of the second differential transistor pair and the outputs of the third differential transistor pair are selectively passed simultaneously.

2. A dual mode comparator circuit according to claim 1 further comprising:
   a comparator back end coupled to the output of the multiplexor.

3. A dual mode comparator circuit according to claim 2, wherein the comparator back end includes a cascode stage.

4. A dual mode comparator circuit according to claim 1, wherein the first differential transistor pair, the second differential transistor pair, and the third differential pair comprise bipolar transistors, each having a collector, emitter and base.

5. A dual mode comparator circuit according to claim 4, wherein the multiplexor is electrically coupled to each collector of the bipolar transistors of the first, second, and third differential transistor pairs.

6. A dual mode comparator circuit according to claim 5, wherein in a first state the multiplexor couples the collectors of the second and the third differential transistor pairs with a voltage rail and in a second state the multiplexor couples the collectors of the second and third differential transistor pairs with a current source.

7. A dual mode comparator circuit according to claim 5, wherein the emitters of an input pair of transistors of the multiplexor are coupled to the collectors of the first differential transistor pair and the collectors of an output pair of transistors of the multiplexor are coupled to a comparator back end.

8. A dual mode comparator circuit according to claim 1, wherein the third differential transistor pair provides an offset voltage for the output of the second differential pair.

9. A method for selecting a signal in a dual mode comparator, the method comprising:
   receiving a first single-ended signal;
   receiving a second single-ended signal;
   receiving a reference signal;
   in response to a selection signal, selecting with a multiplexor either a differential output signal resulting from a comparison of the first and second single-ended signals or a single-ended output signal resulting from a comparison of the first single-ended signal with the reference signal; and
   providing the selected output signal to a gain stage circuit.

10. The method according to claim 9, wherein the first and second single-ended signals originate from a plurality of ports of one or more devices under test.

11. The method according to claim 9, wherein the comparison is performed using a differential transistor pair.

12. The method according to claim 11, wherein the dual mode comparator includes a plurality of differential transistor pairs each coupled to selectable inputs of the multiplexor.

13. The method according to claim 11, wherein the first single-ended and second single-ended signals are voltages and the selected output signal is proportional to a resulting differential voltage of the differential transistor pair.

14. A method according to claim 11, wherein the differential transistor pair is a bipolar differential transistor pair.

15. The method according to claim 9, wherein the gain stage circuit includes a cascode amplifier.

16. The method according to claim 9, wherein the dual mode comparator operates within automatic testing equipment and tests signals from one or more device under test.

17. A dual mode comparator circuit, the dual mode comparator circuit comprising:
   at least three differential transistor pairs each having a plurality of inputs and at least one output;
   a multiplexor coupled to the output of each of the at least three differential transistor pairs, the multiplexor including an input for receiving a selection signal; and
   a comparator back end;
   wherein the multiplexor selectively couples the output of a plurality of differential transistor pairs simultaneously with the comparator back end.

18. A dual mode comparator circuit according to claim 17, wherein the comparator back end includes a cascade stage.

19. A dual mode comparator circuit according to claim 17, wherein the comparator back end produces an output, and wherein the output is a differential signal proportional to a differential input signal received at the inputs of the selected one or more differential transistor pairs.

* * * * *